United States Patent [19]
Snyder

[11] Patent Number: 5,863,828
[45] Date of Patent: Jan. 26, 1999

[54] TRENCH PLANARIZATION TECHNIQUE

[75] Inventor: John Snyder, Los Altos, Calif.

[73] Assignee: National Semiconductor Corporation, Santa Clara, Calif.

[21] Appl. No.: 719,475

[22] Filed: Sep. 25, 1996

[51] Int. Cl.[6] .................................................. H01L 21/76
[52] U.S. Cl. ......................... 438/437; 438/692; 438/699; 438/725
[58] Field of Search ..................................... 438/424, 437, 438/692, 693, 699, 702, 227, 725, 132

[56] References Cited

U.S. PATENT DOCUMENTS

| | | |
|---|---|---|
| 4,654,120 | 3/1987 | Dougherty . |
| 4,764,483 | 8/1988 | Fuse et al. . |
| 4,876,216 | 10/1989 | Tobias et al. . |
| 5,077,234 | 12/1991 | Scoopo et al. . |
| 5,139,608 | 8/1992 | Grivna . |
| 5,175,122 | 12/1992 | Wang et al. . |
| 5,245,213 | 9/1993 | Huang . |
| 5,498,565 | 3/1996 | Gocho . |
| 5,560,802 | 10/1996 | Chisolm . |
| 5,604,149 | 2/1997 | Paoli et al. . |
| 5,641,704 | 6/1997 | Paoli et al. . |

OTHER PUBLICATIONS

K. Blumenstock, "Shallow trench isolation for ultra–large–scale integrated devices", (date unknown).

S.S. Cooperman et al., "Optimization of a Shallow Trench Isolation Process for Improved Planarization", J. Electrochem. Soc., vol. 142, No. 9, Sep. 1995, pp. 3180–3185.

S. Poon et al., "A Trench Isolation Process for BiCMOS Circuits", IEEE 1993 Bipolar Circuits and Technology Meeting 3.3.

B. Davari et al., A New Planarization Technique, Using a Combination of Rie and Chemical Mechanical Polish (CMP), IEDM 89–61, pp. 3.4.1–3.4.4, 1989.

A. Perera et al., "Trench isolation for 0.45 um Active Pitch and Below", IEDM 95–679, pp. 28.1.1–28.1.4, 1995.

*Primary Examiner*—George Fourson
*Attorney, Agent, or Firm*—Limbach & Limbach L.L.P.

[57] ABSTRACT

Disclosed are methods for planarizing a pattern of trenches and pillars on a substrate. The trenches are filled by depositing a filler material to a thickness greater than or equal to their depth. Photoresist is then patterned to open at least some areas overlying at least some of the pillars. Exposed resist and filler are then etched isotropically simultaneously to substantially planarize the pattern. In one embodiment, the ratio of resist etch rate to filler etch rate is greater than 1.0. In another embodiment, planarization may be achieved by etching filler material in nonactive areas without exposing caps of capped pillars, e.g., etching with endpoint detection. Then, caps of the capped pillars may then be exposed. These methods may be used in conjunction with chemical mechanical polishing steps with reduced pattern sensitivity, avoiding dishing and isolated pillar erosion.

27 Claims, 8 Drawing Sheets

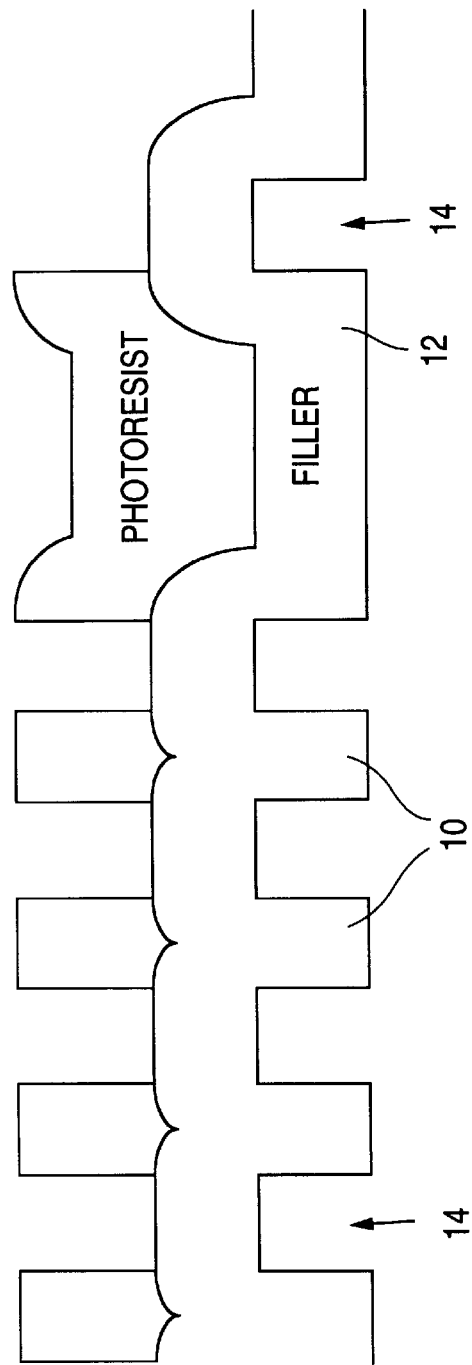
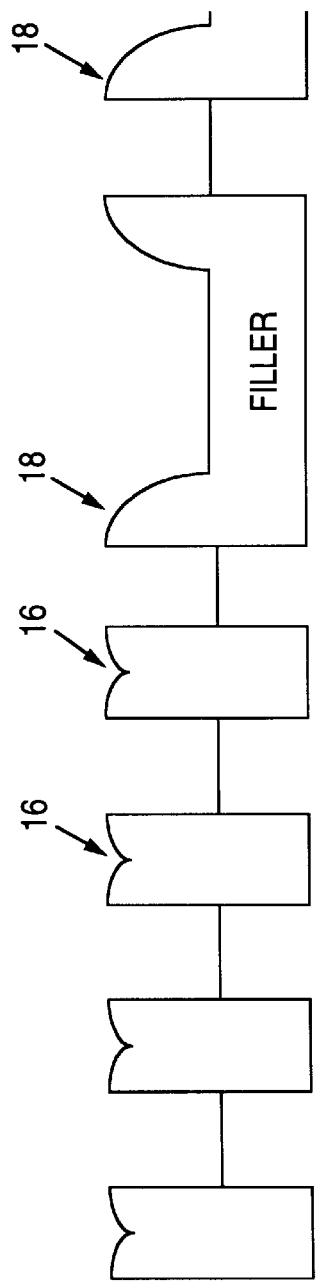
FIGURE 1a (PRIOR ART)
FIGURE 1b (PRIOR ART)

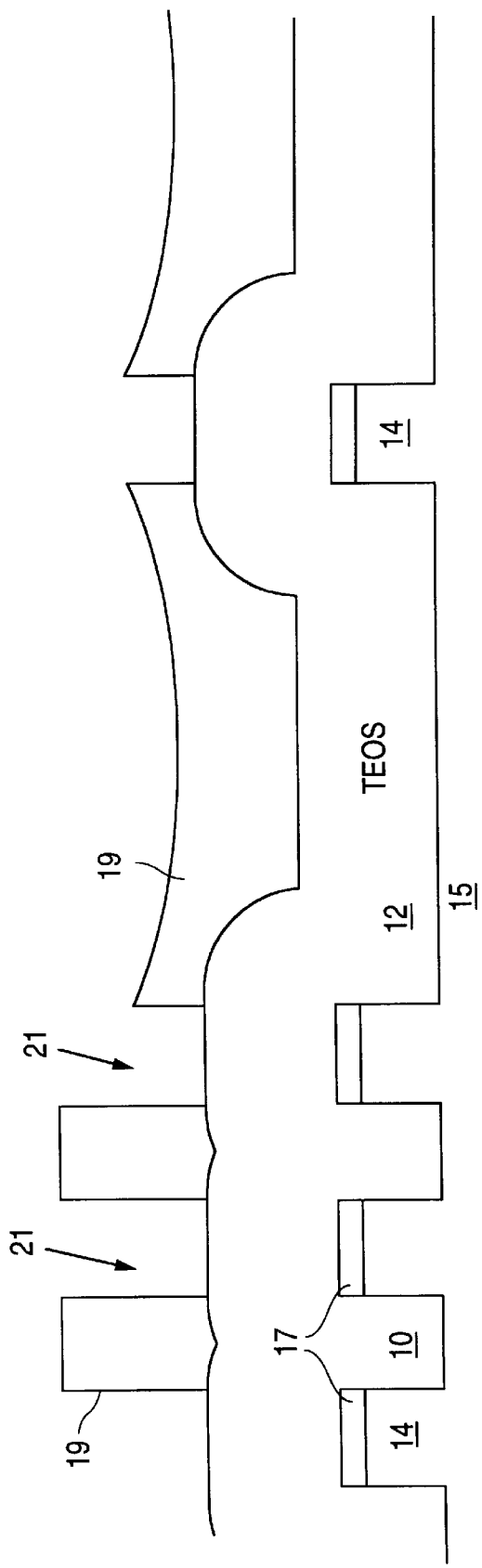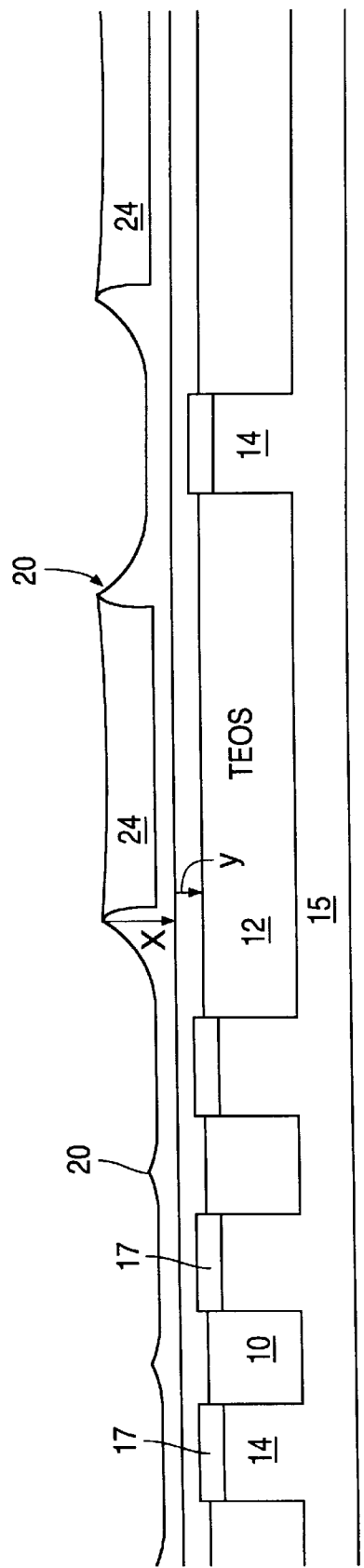

TRENCH PLANARIZATION TECHNIQUE

BACKGROUND OF THE INVENTION

1. Field of the Invention

The present invention relates to a novel technique for the planarization of filled trenches. This technique involves isotropically etching $SiO_2$-filled trenches and resist and chemical mechanical polishing (CMP) without polishing to the "active" regions on the wafer surface.

2. Description of the Related Art

Etching trenches into silicon wafers in order to electrically isolate the various active regions of an electronic circuit is a well known technique. Because it is desirable to facilitate future processing, to maintain a planar upper surface on the wafer, chemical vapor deposition (CVD) techniques are used to fill trenches with an electrically insulating material such as $SiO_2$. However, CVD deposits oxide in both trenches and on top of pillars in the active regions (e.g., as shown in the exemplary pattern in FIG. 1a) Therefore some kind of planarization procedure must be used to achieve nominally flat top surfaces. Chemical mechanical polishing (CMP) of the as-deposited material is perhaps the simplest approach, but this technique suffers from local polish rate variations as well as dishing and problems associated with oxide residues. These variations generally may be said to be caused by the finite stiffness of the pads conventionally used for CMP, variations of the local pattern density and because different materials etch at different rates during CMP.

For example, the local etch rate strongly depends on the pattern of nearby trenches 10 and, specifically, the density of these patterns. One problem caused by nonuniformities in local etch rates is "dishing" in wide open trench areas 12, where trench areas and nontrench areas etch at different rates. Because of pad flexibility, some filler residue may be left on top of active areas between trenches, detracting from flatness.

Another problem is the rapid erosion of small isolated non-trench features ("pillars" 14) in wide open trench areas. The pad flexibility over such isolated pillars leads to fairly localized polishing action so that there is accelerated erosion, especially at the upper corners of the pillars.

Although many of the disadvantages of CMP are related to pad flexibility, increasing the stiffness of the pads is not generally a useful solution. Some pad flexibility is needed in order for the pad to conform to gross wafer bowing.

For these reasons, CMP of CVD oxide deposited on pillars and in trenches of varying widths and lengths is not generally practiced or recommended.

More advanced planarization processes involve an additional lithography step that essentially protects material in the trench regions while exposing material in the non-trench (active) regions. An etch is then performed that removes the bulk of the filler oxide on top of the pillars (the "pillar oxide"). Typically, this etch is an anisotropic plasma etch that leaves "ears" 16 and 18 of filler material, exemplified in FIG. 1b. While a significant amount of filler material has been removed from the active regions in such an etch step, a significant fraction in the form of ears remains. When this step is followed by CMP, there is still potential for pattern-dependent polishing as described above.

U.S. Pat. No. 5,498,565, issued to Gocho and assigned to Sony Corp., offers some improvement by using an isotropic (as opposed to an anisotropic) oxide etch to remove an even greater fraction of pillar oxide. Gocho describes a method of filling trenches by simultaneously depositing and etching (i.e., a ECR-CVD process) a CVD oxide. The deposited layer is then masked with resist, isotropically etched and then polished using a CMP technique. Gocho teaches a technique that is superior to the prior art with respect to reduced pattern sensitivity of the final polishing step through the use of an isotropic oxide etch and more efficient removal of pillar oxide.

However, Gocho fails to teach how to overcome problems of isolated resist line lift-off. An isotropic etch, as Gocho proposes, will undercut the resist mask. If this occurs on both sides of a narrow resist line, then it is possible to completely undercut, and thereby liberate, the resist line. The line is then free from the surface and can lift off, fall over or land on another part of the substrate, interfering with isotropic etching where it lands.

It would therefore be desirable to have a simple and effective trench planarization technique with lower pattern sensitivity capable of use with small geometries.

SUMMARY OF THE INVENTION

Methods according to the present invention address these and other problems by enabling removal of a substantial fraction of the material from the active region prior to CMP, thereby reducing pattern dependency of the CMP step and avoiding dishing and isolated pillar erosion.

In one technique according to the present invention, after a trench/capped pillar pattern has been covered with a filler material, selective removal of this filler material over the capped pillar region is achieved simply by isotropically etching filler and patterned resist simultaneously. By this technique, it is possible to remove close to 90% of the filler material in the active region, a vast improvement over that achieved with conventional planarization techniques using anisotropic etch (FIG. 1b). Any remaining "cusps" are smaller and therefore can be removed effectively and quickly in subsequent CMP processing.

When methods according to the present invention are carried out such that the ratio of resist etch rate to filler etch rate is greater than 1.0, the likelihood of dangling resist lines is reduced, cusps may be etched to a greater extent prior to CMP and gas phase transport of etchant to cusp areas is enhanced. After such an isotropic resist/filler etch, CMP may be used to polish back the top surface of the filler without exposing the caps of the capped pillars. The final etch step exposes the caps on the pillars. This technique completely avoids dishing, oxide residue, and isolated pillar erosion problems.

BRIEF DESCRIPTION OF THE DRAWINGS

The invention will be better understood by reference to the appended Figures, in which like reference numerals refer to the same element:

FIG. 1a illustrates a cross section of a pattern of filled trenches and pillars before etching according to the prior art;

FIG. 1b illustrates a cross-section of the filled trenches after an anisotropic filler etch according to the prior art;

FIG. 2 illustrates a cross-section of trenches that have been filled with a filler material using chemical vapor deposition and patterned with an "inverse" active photoresist layer;

FIG. 3 illustrates a cross-section of the filled trenches after an isotropic filler etch;

DESCRIPTION OF THE PREFERRED EMBODIMENTS

Figure 4:
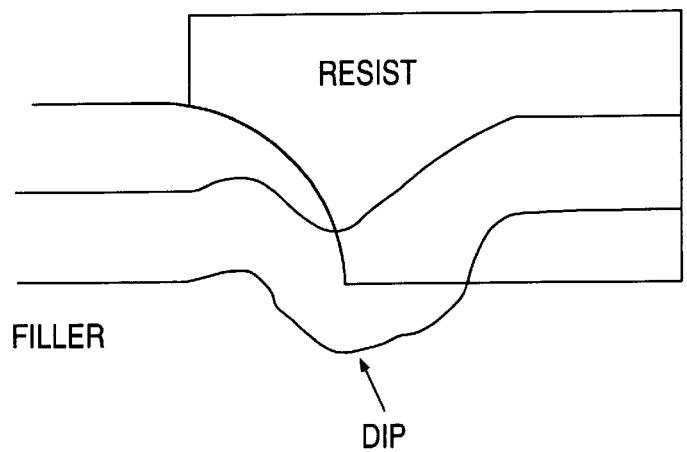
FIG. 4 illustrates an exploded and partial cross-sectional view of an etched region where dipping occurs.

Methods according to the present invention are discussed with particular reference to FIGS. 2 and 3. Generally, methods according to the present invention relate to improved planarization techniques having reduced sensitivity to variations of the trench pattern across a substrate, e.g., trench and pillar density.

Planarization methods generally are carried out on a pattern of pillars 14 and filled trenches 10 formed on a substrate 15 such as a silicon wafer (FIG. 2). The general scheme of methods according to the present invention follows.

Filler material 12, commonly an oxide, is deposited as a layer on the pattern by a method such as CVD and may be densified as known in the art. FIG. 2 shows a conformal layer of oxide that has been deposited. Pillars may have caps 17 composed of nitride or other material as known in the art to protect the pillars during subsequent processing. A liner oxide may be grown to prepare the substrate before filler deposition.

A photoresist layer 19 is applied and patterned according to the pattern of underlying trenches and pillars. That is, in patterning the resist, it is generally desirable that openings or "gaps" 21 in the resist directly overlie at least some pillars. Preferably, the patterned resist is the "perfect inverse" of the underlying pattern of the trenches and pillars so that the resist is removed only from areas directly overlying the pillars, as shown in FIG. 2. More preferably, the width of gaps opened in the resist are within about 5% of the pillar width. The thickness of the resist layer applied should be thick enough to avoid complete removal of the resist during the subsequent isotropic resist/oxide etch. FIG. 2 illustrates an exemplary profile of a substrate at this stage of processing according to the present invention.

Next, exposed areas of filler and resist are etched simultaneously. In a preferred embodiment, etching is carried out isotropically, e.g., with one or more wet etchants such as HF, $H_2O_2$, $H_2SO_4$ or $HNO_3$. (Alternatively, the etch may be a dry etch, such as a plasma etch, for example, using $CH_3F$ or $CF_4$ with relatively increased oxygen content). FIG. 3 illustrates an exemplary profile at this stage of processing according to the present invention.

As can be seen in FIG. 3, substantial portions of resist 19 and filler 12 have been removed, leaving only small cusps 20 not only in the relatively wide open areas, but over trenches 10 as well. The major part of planarization has thus been achieved, in contrast to conventional planarization techniques using anisotropic etches followed by resist stripping. Resist 24 remaining between cusps 20 in wide open areas can be stripped easily by conventional methods. Arrows "x" and "y" indicate how the profile changes with subsequent processing steps in other aspects of the present invention discussed below.

Simultaneous isotropic etching of the resist and filler material avoids the problem of dangling narrow resist lines produced in conventional filler etching techniques that are highly selective to resist. In these conventional isotropic etches, dangling resist lines are either suspended above the filler (if the thin resist line is relatively short), or collapse or fall over, in the case of long lines. The latter situation is the most worrisome, as a line of resist that has toppled over can inhibit the filler etch in an area that it should not. If resist is etched free from the underlying filler, it can cause contamination.

An elegant solution to this problem is to equate the etch rates of the filler and the resist during this step. Equal etch rates of these materials ensure that pieces of resist will not be "etched free". In fact, this is true for any combination of etch rates of filler and resist satisfying Equation (1):

$$\frac{\text{etch rate of filler}}{\text{etch rate of resist}} < 1.0 \tag{1}$$

However, when Equation 1 is satisfied, there is the possibility of premature trench oxide exposure that can result in "dips" below the nominal filler level after etch, as shown in FIG. 4. (FIG. 4 is based on the assumption that the resist thickness is ~33% greater than the filler step, and takes a worst case example of the top surface of the resist remaining flat over the step.) Dipping is worsened by higher resist etch rates, steeper filler sidewall profiles and thinner resists. Even if the resist were infinitely thick, dipping may still result due to lateral etching of the resist if the ratio of resist etch rate to filler etch rate is sufficiently large and the filler sidewall is sufficiently steep. Assuming a circular filler sidewall and that the isotropic resist etch proceeds at a uniform rate along this sidewall, then the resist etch rate can exceed the filler etch rate by as much as a factor of $\pi/2$ before dipping occurs. FIG. 4 shows boundary condition for an infinitely thick resist where:

$$\frac{\text{resist etch rate}}{\text{filler etch rate}} = \frac{\pi}{(2)} \approx 1.57 \quad (2)$$

For finite resist thickness, topside resist etching aids the lateral resist etching so that Equation 2 is an upper limit of the resist etch rate to filler etch rate ratio, beyond which dipping will definitely occur, and below which dipping may occur, depending on the resist thickness.

Figure 5:
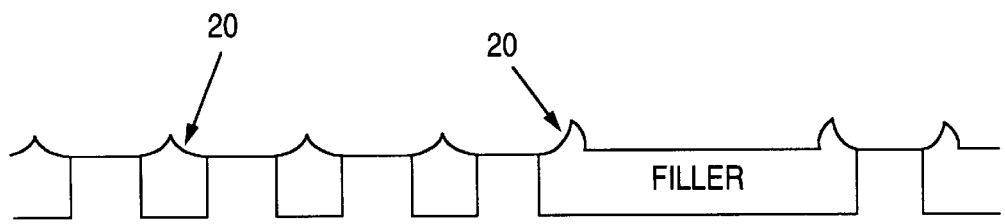
FIG. 5 illustrates a cross-section after isotropic etch according to the present invention.

Resist etch rate to filler etch rate ratios greater than 1.0 are particularly desirable: 1) to prevent separation of thin resist lines from the underlying filler due to resist undercut; 2) to aid in the gas phase transport of etchant to the filler "cusps" 20 (FIG. 5); and 3) to etch the "cusps" to a greater degree than achieved with a 1.0 etch rate ratio isotropic etch.

Figure 6:
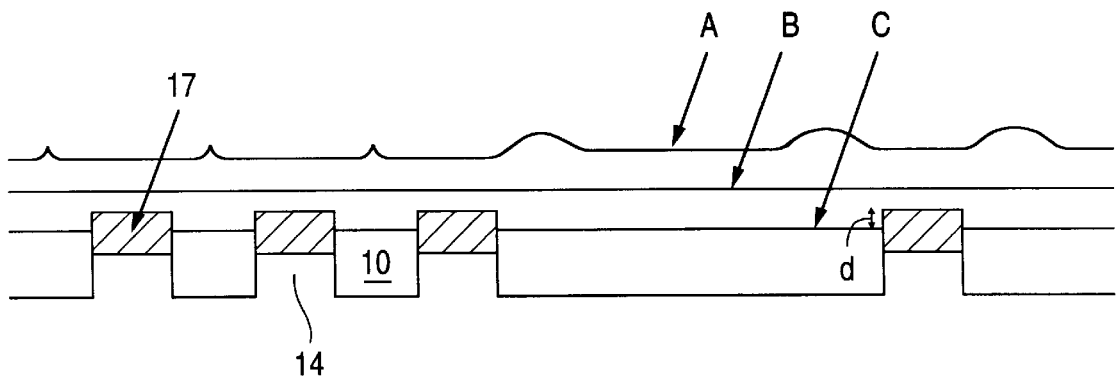
FIG. 6 illustrates cross sectional views of a filled trench and pillar pattern at several stages of processing according to methods of the present invention.

After the simultaneous etching of filler and resist, remaining filler may be removed, e.g., "touch" polished by CMP, to remove any remaining cusps 20, as shown in the profile marked as line "b" in FIG. 6. This CMP step need only be brief since cusps remaining after isotropic etch as discussed above are much smaller than ears that would remain after etching filler only, e.g., by conventional anisotropic techniques. The polish should be stopped before reaching underlying active areas, as shown in the profile marked as line "b" in FIG. 6 and arrow "x" of FIG. 3, to avoid differential polish rates and the consequent dishing, oxide residue and isolated pillar erosion effects. As shown as line "b" in FIG. 6 and arrow "y" of FIG. 3, a CMP step that stops before the active regions are reached, as proposed in methods according to the present invention avoids these effects.

A final etch may be carried out to remove filler material in nonactive areas. In this step, it is important to control the final step height d between the top of the filler to the top of the active area cap (shown in FIG. 6). An etching technique with endpoint detection of (or timed etching until) exposure of the active area caps allows active feedback (for an individual wafer) and control the final step height d is particularly useful. For example, an HF dip may be used to expose nitride caps.

Figure 7:
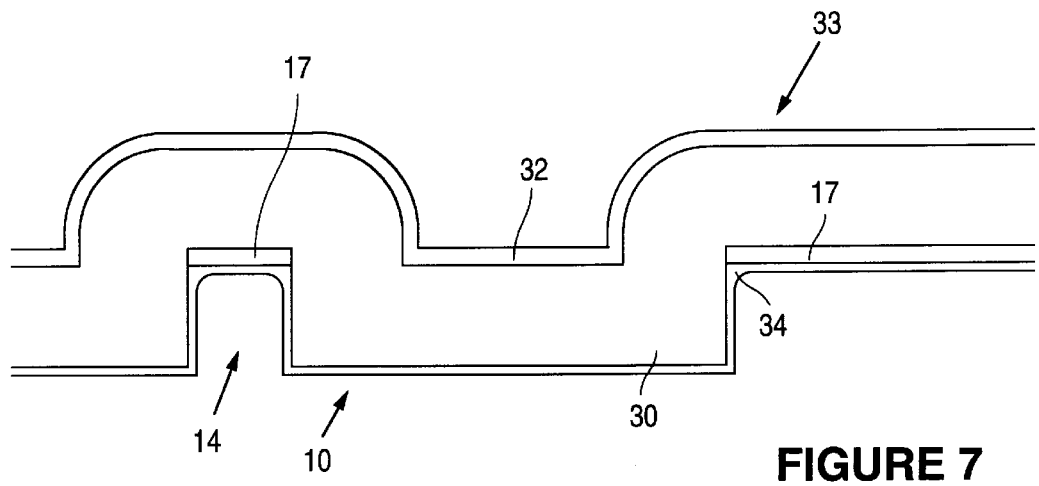
FIG. 7 illustrates a cross-section of trenches that have been filled with a bilayer filler material according to the present invention.
Figure 8:
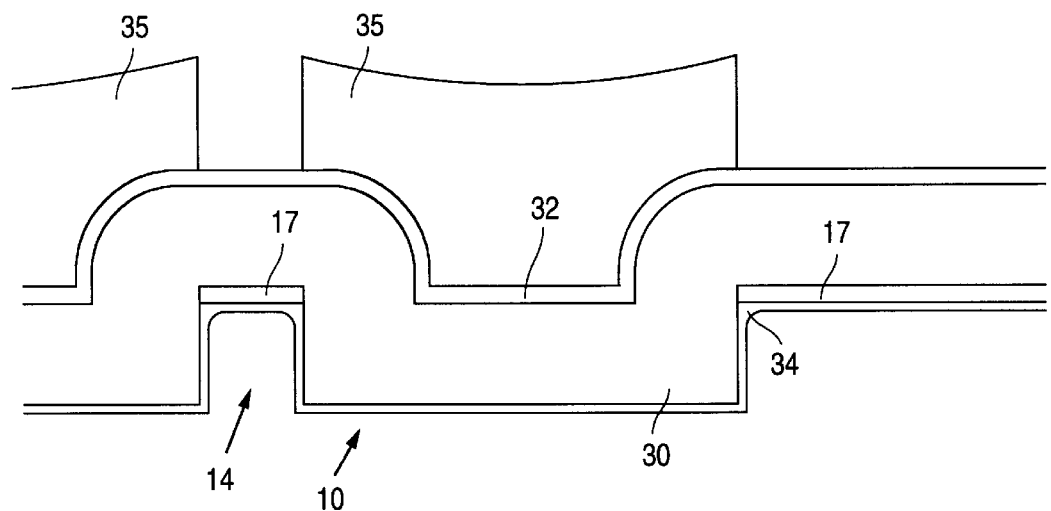
FIG. 8 illustrates a cross-section of trenches filled with a bilayer filler material after perfect inverse mask patterning according to the present invention.

FIGS. 7 through 11 illustrate another aspect of the present invention. In FIG. 7, filler material may be composed of a bilayer structure of two materials. For example, as shown in FIG. 7, an oxide layer 30, e.g., a CVD TEOS, and then a nitride layer 32, e.g., $Si_3N_4$, are deposited over the pattern of pillars 14 (having nitride caps 17), trenches 10 and field oxide regions 33. A thin layer of a "liner oxide" 34 underlying the nitride caps 17 and oxide layer 30 "rounds" the corners of the pillars and trenches. The thickness of oxide layer 30 and nitride layer 32 should equal the trench depth, so that the top surface of nitride caps 17 and nitride layer 32 are co-planar and can thereby act simultaneously as a polish "stop" during subsequent processing according to the present invention.

A mask 35 applied on top of the oxide/nitride bilayer filler is patterned to provide a "perfect inverse" of the underlying pattern of pillars and trenches, as discussed above, and shown in FIG. 8. That is, the resist is patterned so that it is removed directly above the pillars and wide open areas, but remains above trenches.

Figure 9:
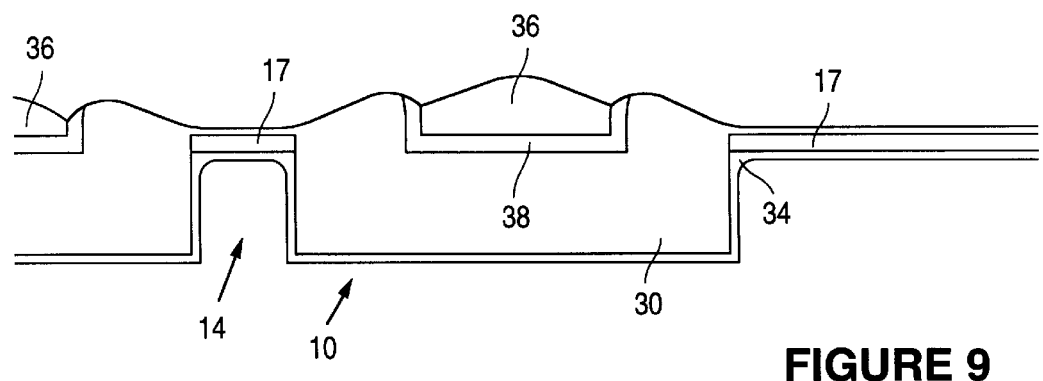
FIG. 9 illustrates a cross-section of trenches after isotropic etch to remove resist, nitride and oxide layers according to the present invention.

Next, an isotropic etch is carried out to remove resist, nitride and oxide simultaneously. FIG. 9 shows the profile after this isotropic etch. The amount of material removed during this etch is less than the sum of the thicknesses of the nitride layer 32 and oxide layer 30, so that a thin oxide layer remains over the nitride caps 17. Portions of resist 36 remain over nitride layer portions 38 in the trench region.

Figure 10:
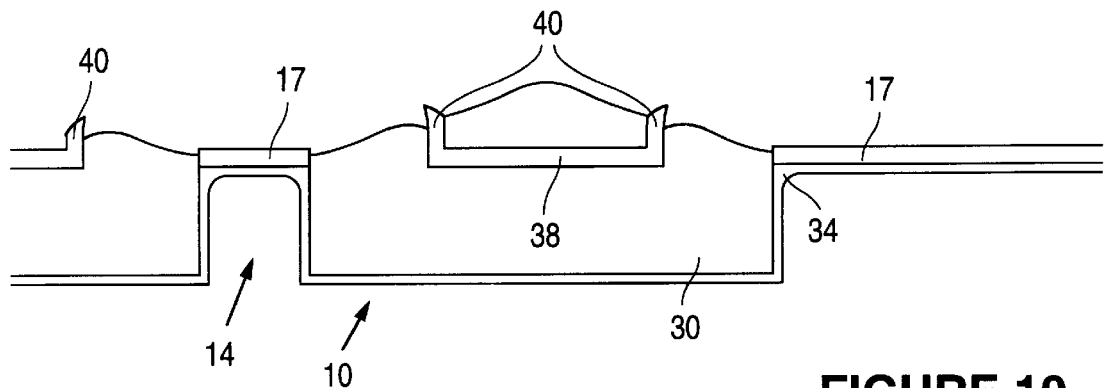
FIG. 10 illustrates a cross-section of trenches after resist strip and isotropic etch steps according to the present invention.

As shown in FIG. 10, active area nitride caps 17, horns 40, and nitride layer portions 38 are exposed after resist portions 36 are stripped and a brief HF dip.

Figure 11:
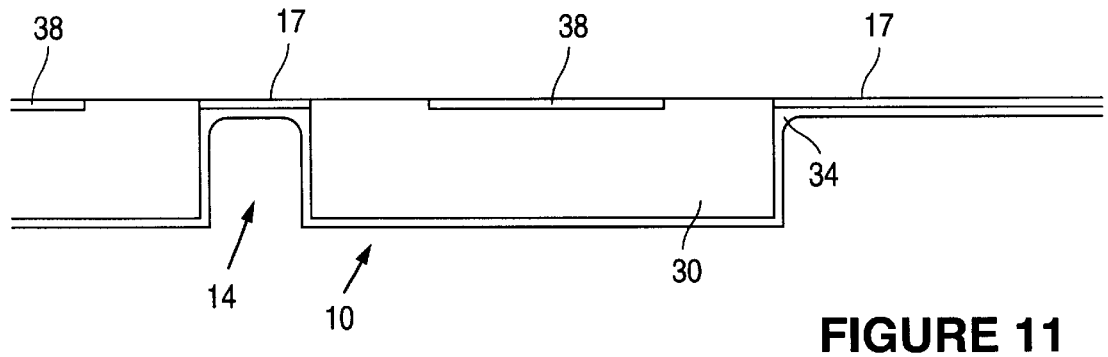
FIG. 11 illustrates a cross-section of trenches after brief CMP "touch" polish to remove nitride caps according to the present invention.

Removal of nitride caps 17 and nitride layer portions 38 sufficient to substantially planarize the surface is achieved by a brief CMP "touch" polish, as shown in FIG. 11. The effects of dishing, oxide residues remaining in the active areas, and erosion of isolated pillars are avoided due to the substantially planar nature of the surface and the almost complete surface coverage by nitride.

Hot phosphoric acid (155° C.) may be used to strip off caps prior to subsequent processing, e.g., pad oxide removal, gate oxide growth, gate deposition and patterning, etc.

Figure 12:
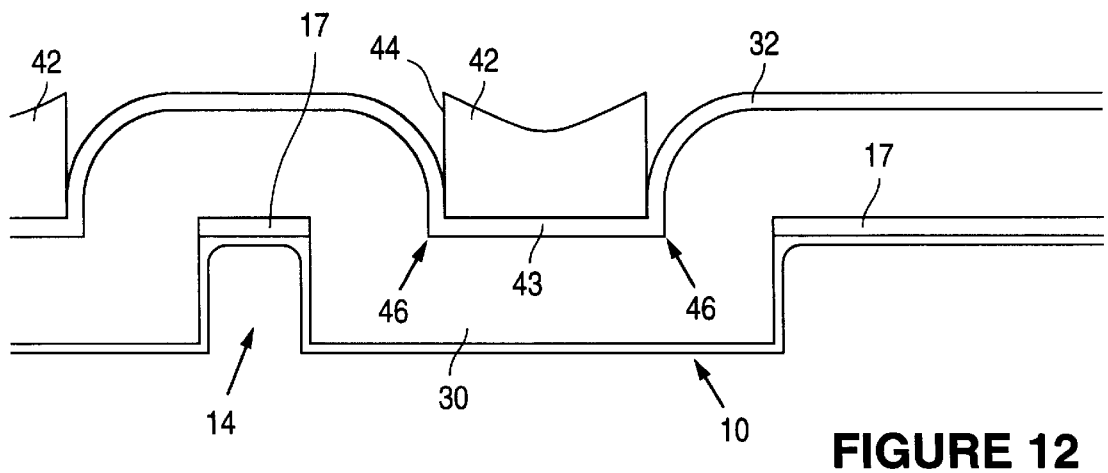
FIG. 12 illustrates a cross-section of trenches filled with a bilayer filler material after biased inverse mask patterning according to the present invention.

Methods according to the present invention can be adapted to incorporate an anisotropic etch, as shown in FIGS. 12 through 16. Trench etch and bilayer filler deposition have been completed as shown and described above with reference to FIG. 7. Then as shown in FIG. 12, photoresist 42 is masked only over filled trenches 10, i.e., the mask is an inverse of the trench pattern. However, the mask is "biased" such that photoresist 42 covers only the flat portion 43 of nitride layer 32; thus, edges 44 of photoresist 42 may be said to "intersect" corners 46 of nitride layer 32 overlying a filled trench 10. Without this biasing, nitride horns 40 of significant size remaining after etching would interfere with mechanical polishing.

Figure 13:
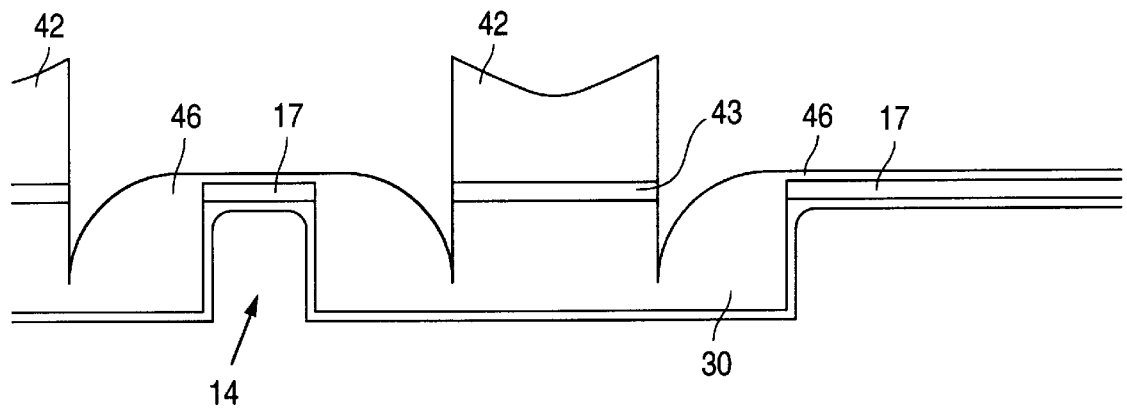
FIG. 13 illustrates a cross-section of trenches filled with a bilayer filler material after timed anisotropic etch according to the present invention.

FIG. 13 illustrates the profile after a timed, nonendpointed anisotropic etch. The etch is sufficient to remove most of oxide layer 30, leaving oxide portions 46 covering nitride caps 17. In addition, nitride layer 32 is removed everywhere except underneath resist 42.

Figure 14:
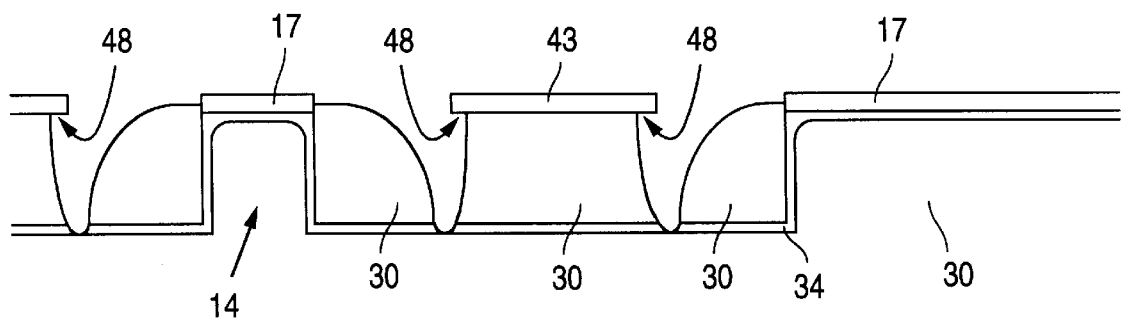
FIG. 14 illustrates a cross-section of trenches filled with bilayer filler material after resist strip and brief HF dip to expose active area nitride caps according to the present invention.
Figure 15:
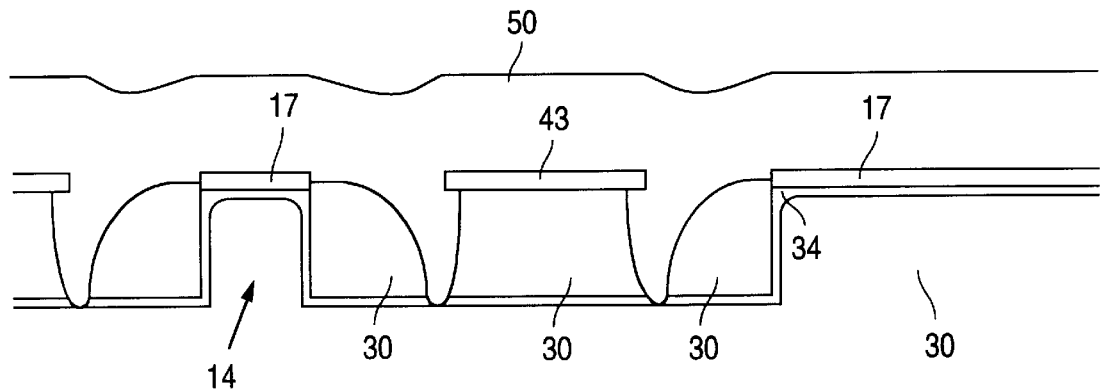
FIG. 15 illustrates a cross-section of bilayer filler material-filled trenches after a second oxide filler deposition according to the present invention.

In the next step, nitride caps 17 and flat portion 43 of nitride layer 32 are exposed following stripping of resist 42 and a brief HF dip to remove a small amount of oxide over the pillars. As can be seen in FIG. 14, the profile at this stage of processing is somewhat rounded and flat portion 43 of nitride layer 32 has been undercut in areas 48. These areas 48 need to be filled, e.g., by deposition of another oxide layer 50 to increase the height of the upper surface of the profile above a desired polish line, as shown in FIG. 15.

Figure 16:
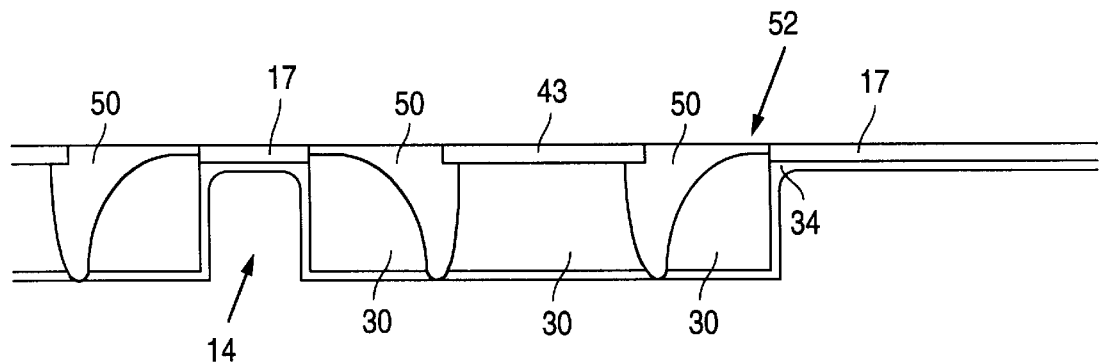
FIG. 16 illustrates a cross-section of bilayer filler material-filled trenches after a final CMP polish to expose nitride caps according to the present invention.

A CMP polish is completed to planarize the surface down to nitride caps 17 and flat portions 43 of nitride layer 32 to the desired level, e.g., line 52. The profile at this stage of processing is shown in FIG. 16.

Figure 17:
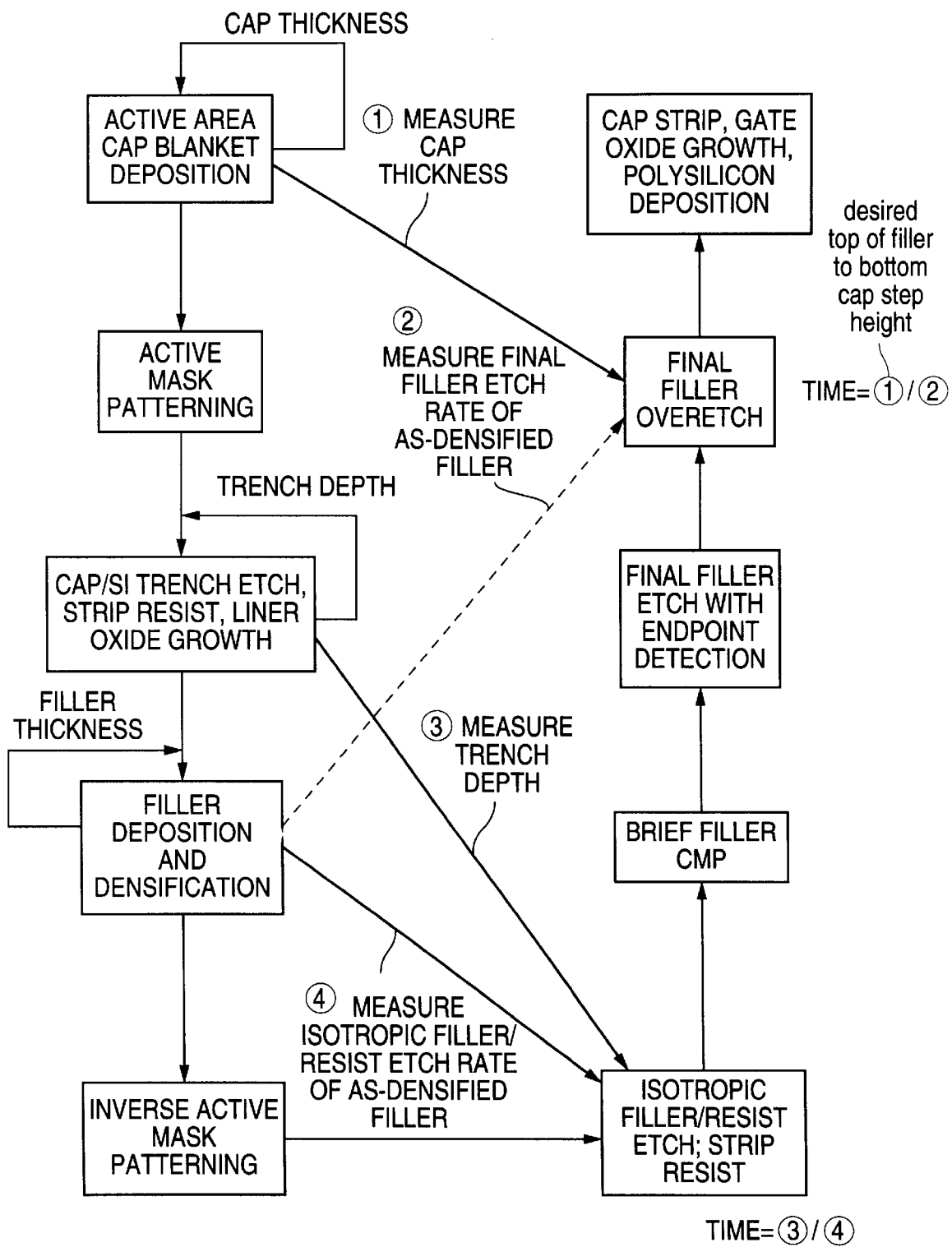
FIG. 17 is a process flow chart identifying steps of a method for process control according to the present invention including feedforward and feedback paths.

Another useful feature of methods according to the present invention is the ability to correct (to the first order) variations with respect to trench depth, filler thickness and CMP polish on a wafer-to-water basis. FIG. 17 illustrates several feedforward paths that advantageously allow for corrections of errors made in previous process steps to be introduced later. Errors in the following can be corrected for later in the process: active area cap thickness, silicon trench depth, filler thickness, CMP polish, isotropic filler/resist etch rate, and final filler etch rate.

For example, variations in active area cap thickness can be corrected for in the final filler etch by controlling the extent of filler overetch after exposing pillar caps, thereby maintaining constant top-of-filler to bottom-of-active-area-cap step height. Cap thickness can be measured after cap deposition (point 1 on FIG. 17) and used to adjust the extent of final filler etch or to adjust the amount of active area cap blanket deposition on subsequent wafers to be processed.

To more closely control the variation of step height d across a wafer and between wafers, knowledge of the final trench depth on a wafer (assuming constant trench depth across a wafer) can be used to control the depth achieved during subsequent isotropic filler/resist etch. Trench depth can be measured after trench etch (point 3 on FIG. 17). This information, in conjunction with endpoint detection of the final filler etch, can assist in eliminating wafer-to-wafer step height variation due to trench depth variations.

Feedback paths can also be used to self-correct process flow in methods according to the present invention. For example, in one feedback path, cap thickness data (measured after the final filler overetch) can be fed back to the step immediately preceding cap measurement and deposition step to correct for future runs.

While the present invention is disclosed by reference to the preferred embodiments and examples detailed above, it is to be understood that these examples are intended in an illustrative rather than limiting sense, as it is contemplated that many modifications within the scope and spirit of the invention will readily occur to those skilled in the art and the appended claims are intended to cover such variations.

I claim:

1. A method for planarizing trenches, comprising the steps of:

providing a pattern of trenches and capped pillars on a substrate;

depositing a filler to fill said trenches and cover said capped pillars;

patterning a resist overlying said filler to remove said resist from at least some areas overlying at least some of said pillars;

isotropically etching exposed resist and filler simultaneously, wherein the ratio of the etch rate of resist to the etch rate of oxide is greater than about 1; and polishing filler remaining after said isotropic etching step.

2. A method according to claim 1, wherein said filler is deposited to have a substantially uniform thickness on all exposed horizontal surfaces of said pattern.

3. A method according to claim 1, wherein said filler is deposited to a thickness greater than or equal to the depth of said trenches.

4. A method according to claim 1, wherein resist is patterned such that the width of gaps opened in said resist during patterning is substantially the same as the width of said pillars.

5. A method according to claim 1, wherein said isotropic etching step removes a thickness of filler substantially equal to the depth of said trenches.

6. A method according to claim 1, wherein said polishing step exposes said caps of said capped pillars.

7. A method according to claim 1, wherein said polishing step is halted before exposing said caps and further comprising the step of exposing said caps of said capped pillars during an etching step after said polishing step.

8. A method according to claim 1, wherein said ratio is between about 1 and 1.57.

9. A method according to claim 7, wherein said capped pillars are exposed using an isotropic etch.

10. A method according to claim 7, wherein said capped pillars are exposed using an anisotropic etch.

11. A method of planarizing trenches, comprising the steps of:

a) providing a pattern of trenches and capped pillars on a substrate;

b) filling said trenches and covering said capped pillars by depositing a first filler layer;

c) depositing a second filler layer on said first filler layer;

d) patterning a resist overlying said second filler layer to remove said resist from at least some areas overlying at least some of said pillars;

e) isotropically etching exposed resist and said first and second filler layers simultaneously, wherein the ratio of resist etch rate to first filler etch rate and the ratio of resist etch rate to second filler etch rate are both less than about 1; and f) mechanically polishing remaining filler.

12. A method according to claim 11, wherein said first filler layer comprises silicon dioxide and said second filler layer comprises silicon nitride.

13. A method according to claim 11, wherein the upper surface of said second filler layer is co-planar with the upper surface of said caps of said capped pillars.

14. A method according to claim 11, wherein said ratio is between about 1 and 1.57.

15. A method according to claim 11, wherein said polishing step exposes said caps of said capped pillars.

16. A method according to claim 11, wherein said first and said second filler layers are deposited to have substantially uniform thickness on all exposed horizontal surfaces of said pattern.

17. A method according to claim 11, wherein resist is patterned such that the width of gaps opened in said resist during said patterning is substantially the same as the width of said pillars.

18. A method according to claim 11, wherein said isotropic etching step removes a total thickness of said first and second filler not greater than the depth of said trenches.

19. A method for planarizing trenches, comprising the steps of:

providing a pattern of trenches and capped pillars on a substrate;

depositing a filler to fill said trenches and cover said capped pillars;

patterning a resist overlying said filler to remove said resist from at least some areas overlying at least some of said pillars;

isotropically etching exposed resist and filler simultaneously, wherein the ratio of the etch rate of resist to the etch rate of oxide is less than about 1; and polishing filler remaining after said isotropic etching step.

20. A method according to claim 19, wherein said filler is deposited to have a substantially uniform thickness on all exposed horizontal surfaces of said pattern.

21. A method according to claim 19, wherein said filler is deposited to a thickness greater than or equal to the depth of said trenches.

22. A method according to claim 19, wherein resist is patterned such that the width of gaps opened in said resist during patterning is substantially the same as the width of said pillars.

23. A method according to claim 19, wherein said isotropic etching step removes a thickness of filler substantially equal to the depth of said trenches.

24. A method according to claim 19, wherein said polishing step exposes said caps of said capped pillars.

25. A method according to claim 19, wherein said polishing step is halted before exposing said caps and further comprising the step of exposing said caps of said capped pillars during an etching step after said polishing step.

26. A method according to claim 19, wherein said capped pillars are exposed using an isotropic etch.

27. A method according to claim 19, wherein said capped pillars are exposed using an anisotropic etch.

* * * * *